(12) United States Patent
Huang et al.

(10) Patent No.: US 10,972,127 B2
(45) Date of Patent: Apr. 6, 2021

(54) DECODING SYSTEM AND DECODING METHOD

(71) Applicant: MACRONIX INTERNATIONAL CO., LTD., Hsinchu (TW)

(72) Inventors: Yu-Ming Huang, Taipei (TW); Hsi-Chia Chang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 20 days.

(21) Appl. No.: 16/446,758

(22) Filed: Jun. 20, 2019

(65) Prior Publication Data
US 2020/0403635 A1 Dec. 24, 2020

(51) Int. Cl.
*H03M 13/09* (2006.01)
*H03M 13/11* (2006.01)
*H03M 13/13* (2006.01)
*H03M 13/43* (2006.01)

(52) U.S. Cl.
CPC ....... *H03M 13/09* (2013.01); *H03M 13/1125* (2013.01); *H03M 13/13* (2013.01); *H03M 13/43* (2013.01)

(58) Field of Classification Search
CPC ...... H03M 13/09; H03M 13/13; H03M 13/43; H03M 13/1125; H03M 13/296; H03M 13/2906; H03M 13/45; H03M 13/2957; H03M 13/093; H03M 13/096; G11C 29/00
See application file for complete search history.

(56) References Cited

U.S. PATENT DOCUMENTS

2014/0208183 A1* 7/2014 Mahdavifar ........ H03M 13/296 714/755
2018/0062668 A1* 3/2018 Moon .................... G11C 29/52

OTHER PUBLICATIONS

Zheng et al. Quantization of CRC-aided successive Cancellation list decoders for Polar codes, IEEE, pp. 70-73. (Year: 2018).*
Chen et al., Low complexity list successive cancellation decoding of polar codes using list pruning, IEEE, pp. 1 to 6. (Year: 2016).*

* cited by examiner

*Primary Examiner* — Shelly A Chase
(74) *Attorney, Agent, or Firm* — McClure, Qualey & Rodack, LLP

(57) ABSTRACT

The present disclosure provides a decoding system and method. The decoding system comprises a first decoder and a second decoder. The first decoder is configured to generate an intermediate decoding data by decoding a code data. The second decoder, coupled to the first decoder, wherein the second decoder is configured to generate a plain data by decoding the intermediate decoding data.

15 Claims, 3 Drawing Sheets

Retrieving a code data from an applied device — S410

Decoding, by a first decoder, the code data according to a list having a variable list size to generate an intermediate decoding data — S420

Decoding, by the second decoder, the intermediate decoding data to generate a plain data — S430

DECODING SYSTEM AND DECODING METHOD

BACKGROUND

Technical Field

The disclosure relates to a coding system and a method. More particularly, the disclosure relates to a decoding system and a method.

Description of Related Art

Polar code is a lately provided code which is low-complexity and provably achieves the capacity for a fairly wide array of channels. In the storage or the communication media, the polar codes encode some identical memory cells or channels into better or more reliable bit-channels and into worse or less reliable bit-channels. With corresponding decoding algorithm and the information of the worse channels, the polar code can achieve good reliability.

The polar decoding procedure, such as the successive cancellation list decoding, has to increase the list size to achieve better error-correcting capability. However, the larger the list size, the higher complexity the decoding procedure takes.

SUMMARY

An aspect of the present disclosure is to provide a decoding system. The decoding system comprises a first decoder and a second decoder. The first decoder is configured to generate an intermediate decoding data by decoding a code data according to a list having a variable list size in a first decoding algorithm; and a second decoder, coupled to the first decoder, wherein the second decoder is configured to generate a plain data by decoding the intermediate decoding data in a second decoding algorithm.

Another aspect of the present disclosure is to provide a decoding method, suitable for a decoding system comprising a first decoder and second decoder coupled to the first decoder, wherein the decoding method comprises: generating, by the first decoder, an intermediate decoding data by decoding a code data according to a list having a variable list size in a first decoding algorithm; and generating, by the second decoder, a plain data by decoding the intermediate decoding data in a second decoding algorithm.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
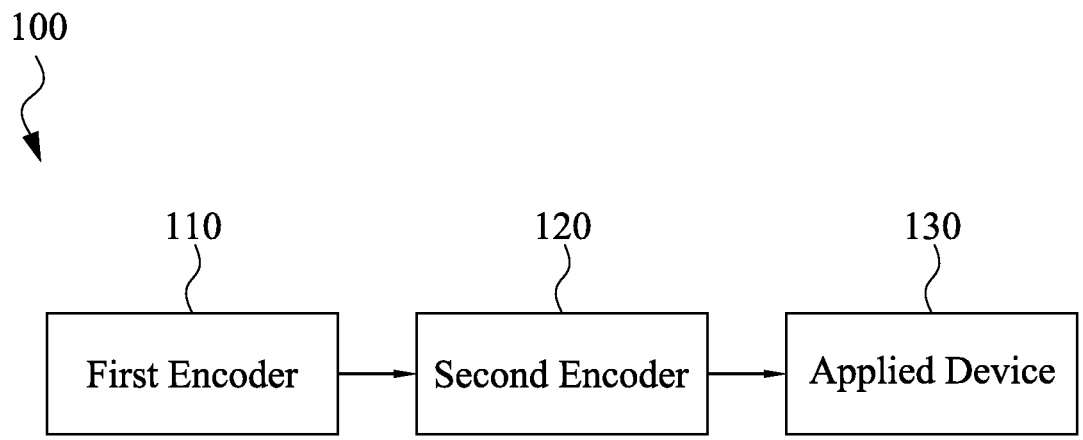
FIG. 1 is a functional diagram illustrating a coding system according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a functional diagram illustrating a coding system 100 according to some embodiments of the present disclosure. In some embodiments, as shown in FIG. 1, the coding system 100 includes a first encoder 110, and a second encoder 120. The first encoder 110 is coupled to the second encoder 120. The first encoder 110 receives a plain data directly or indirectly from other circuit, module, or device (not shown). The plain data can be but not limited to the raw data or the source data that produced by the circuit, module, or device (not shown).

The first encoder 110 is configured to encode the plain data, and to generate an intermediate encoding data. The first encoder 110 can be but not limited to a checksum function circuit, such as the cyclic redundancy check (CRC) coder. In some embodiments, the first encoder 110 attaches a redundancy data, which is partially captured from the plain data and then generated by a CRC code at the partially captured data, at the end of the plain data. Therefore, the generated data is the intermediate encoding data.

The second encoder 120 receives the intermediate encoding data. The second encoder 120 is configured to encode the intermediate encoding data, and to generate a code data. For example, the second encoder 120 can be but not limited to a polar encoder. In some embodiments, the second encoder 120 encodes the intermediate encoding data by applying the polar code, and the polar code data is generated.

The second encoder 120 includes a plurality of input channels and output channels. Taking 4 input channels $U1$, $U2, \ldots, U4$, and 4 output channels $X1$, $X2, \ldots$, and $X4$ as an example. The 4 input channels are configured to receive the plain data. For example, when the plain data has 4 bits, and each of the input channels $U1$-$U4$ receives 1 bit of the plain data. On the other hand, the second encoder 120 has the encoding circuit, for example, the exclusive or gates which execute exclusive or operator among the input channels. In some embodiments, the output channels output data as following: $X1=U1 \oplus U2 \oplus U3 \oplus U4$, $X2=U3 \oplus U4$, $X3=U2 \oplus U4$, $X4=U4$.

Referring to FIG. 1, the coding system 100 further includes an applied device 130. The applied device 130 is coupled to the second encoder 120. In some embodiments, the applied device 130 is a storage device. The applied device 130 stores the code data after receiving the code data. The applied device 130 can be but not limited to a flash memory, a random access memory, a read only memory, a hard disk drive, a solid state drive, and so on. In some other embodiments, the applied device 130 is a transmission module. The applied device 130 processes the code data for wireless transmission. For example, the applied device 130 transmits the code data through wireless communication to a receiver (not shown).

Figure 2:
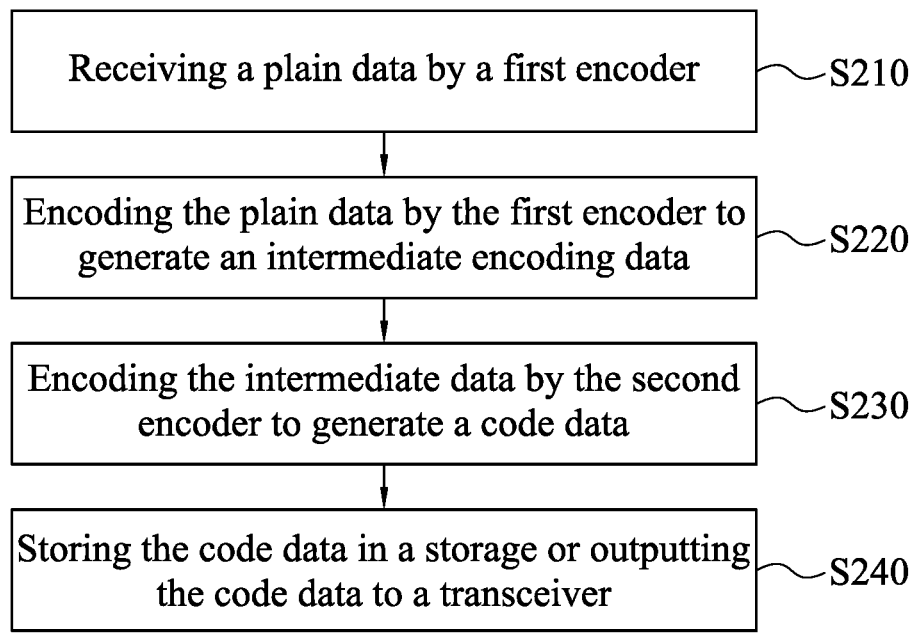
FIG. 2 is a flow diagram illustrating a method for encoding data according to some embodiments of the present disclosure.

Reference is made to FIG. 2. FIG. 2 is a flow diagram illustrating a method for encoding data according to some embodiments of the present disclosure. To illustrate the method for encoding data, please refer to FIG. 2 incorporating with FIG. 1.

In operation S210, the plain data is received by the first encoder 110. In some embodiments, the plain data is the information to be processes. Subsequently, in operation S220, the plain data is encoded by the first encoder 110 to generate the intermediate encoding data. For example, the first encoder 110 calculates the redundancy information of the plain data. The redundancy information and the plain data are assembled together as the intermediate encoding data. It should be noted that any error detection codes and the error correction codes can be used at the first encoder 110 in the present disclosure.

In operation S230, the intermediate data is encoded by the second encoder 120 to generate the code data. In some embodiments, the second encoder 120 applies the polar code at the intermediate encoding data in order to generate the code data. Subsequently, in operation S240, the code data is stored in the storage device or the code data is outputted to the transceiver.

Figure 3:
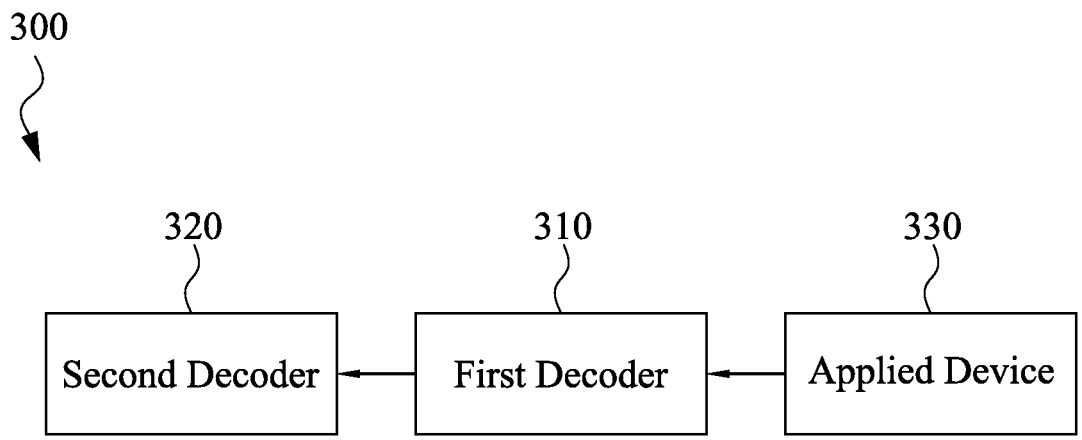
FIG. 3 is a functional diagram illustrating a decoding system according to some embodiments of the present disclosure.

Reference is made to FIG. 3. FIG. 3 is a functional diagram illustrating a decoding system 300 according to some embodiments of the present disclosure. The decoding system 300 corresponds to the coding system 100. For example, the decoding system 300 is configured to process the code data generated by the coding system 100.

As shown in FIG. 3, the decoding system 300 includes a first decoder 310 and a second decoder 320. The first decoder 310 is coupled to the second decoder 320. The first decoder 310 receives the code data directly or indirectly from other circuit, module, or device (not shown). The first decoder 310 is configured to generate the intermediate decoding data by decoding the code data after receiving the code data. The first decoder 310 can be but not limited to a polar decoder. In some embodiments, the first decoder 310 performs the polar decoding algorithm to restore the code data to the intermediate decoding data.

The second decoder 320 receives the intermediate decoding data. The second decoder 320 is configured to generate the plain data by decoding the intermediate decoding data. In some embodiments, the second decoder 320 is a checksum function circuit, such as the cyclic redundancy check (CRC) decoder. In some embodiments, the second decoder 320 performs the error detection algorithm and/or error correction algorithm to restore the intermediate decoding data to the plain data.

Referring to FIG. 3, the decoding system 300 further includes an applied device 330. The applied device 330 is coupled to the first decoder 310. In some embodiments, the applied device 330 is a storage device. The applied device 330 provides the code data in response to reading commands. The applied device 330 can be but not limited to the flash memory, the random access memory, the read only memory, the hard disk drive, the solid state drive, and so on. In some other embodiments, the applied device 330 is a receiver module. The applied device 330 receives the code data through wireless transmission, and provides the code data to the first decoder 310.

Figure 4:
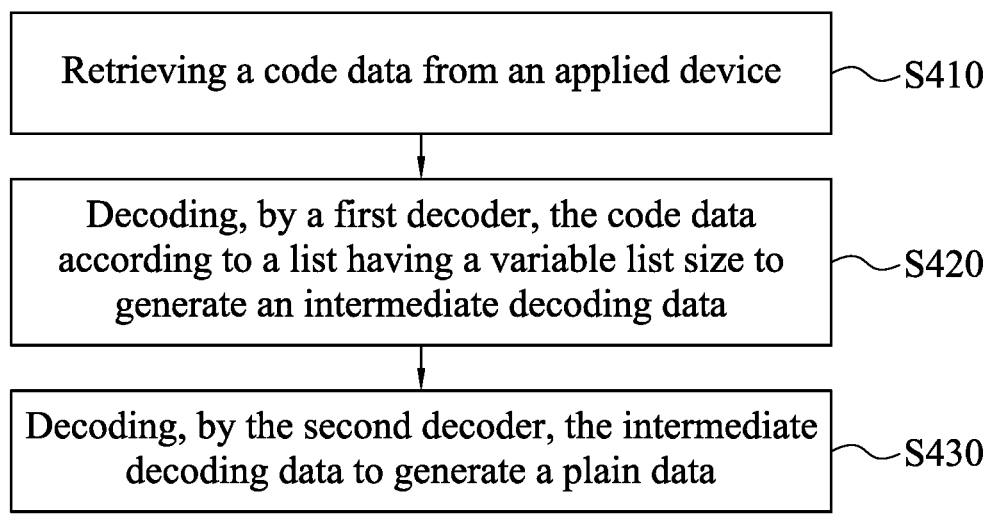
FIG. 4 is a flow diagram illustrating a method for decoding data according to some embodiments of the present disclosure.

Reference is made to FIG. 4. FIG. 4 is a flow diagram illustrating a method for decoding data according to some embodiments of the present disclosure. To illustrate the method for decoding data, please refer to FIG. 3 incorporating with FIG. 4.

In operation S410, the code data is retrieved from the applied device 330. The applied device can be but not limited to a storage or a receiver. In operation S420, the code data is decoded by the first decoder 310 according to a list having a variable list size and generating the intermediate decoding data. In some embodiments, the first decoder is the polar decoder and the code data is the polar code data. The decoding method implements the polar codes with the list, such as a successive cancellation list, and generates a decoding tree which has a plurality of levels. In the document, the size of the successive cancellation list varies according to an error rate of each level of the decoding tree. For more detailed illustration of the polar decoding procedure, the following statements provide exemplary embodiments.

Figure 5:
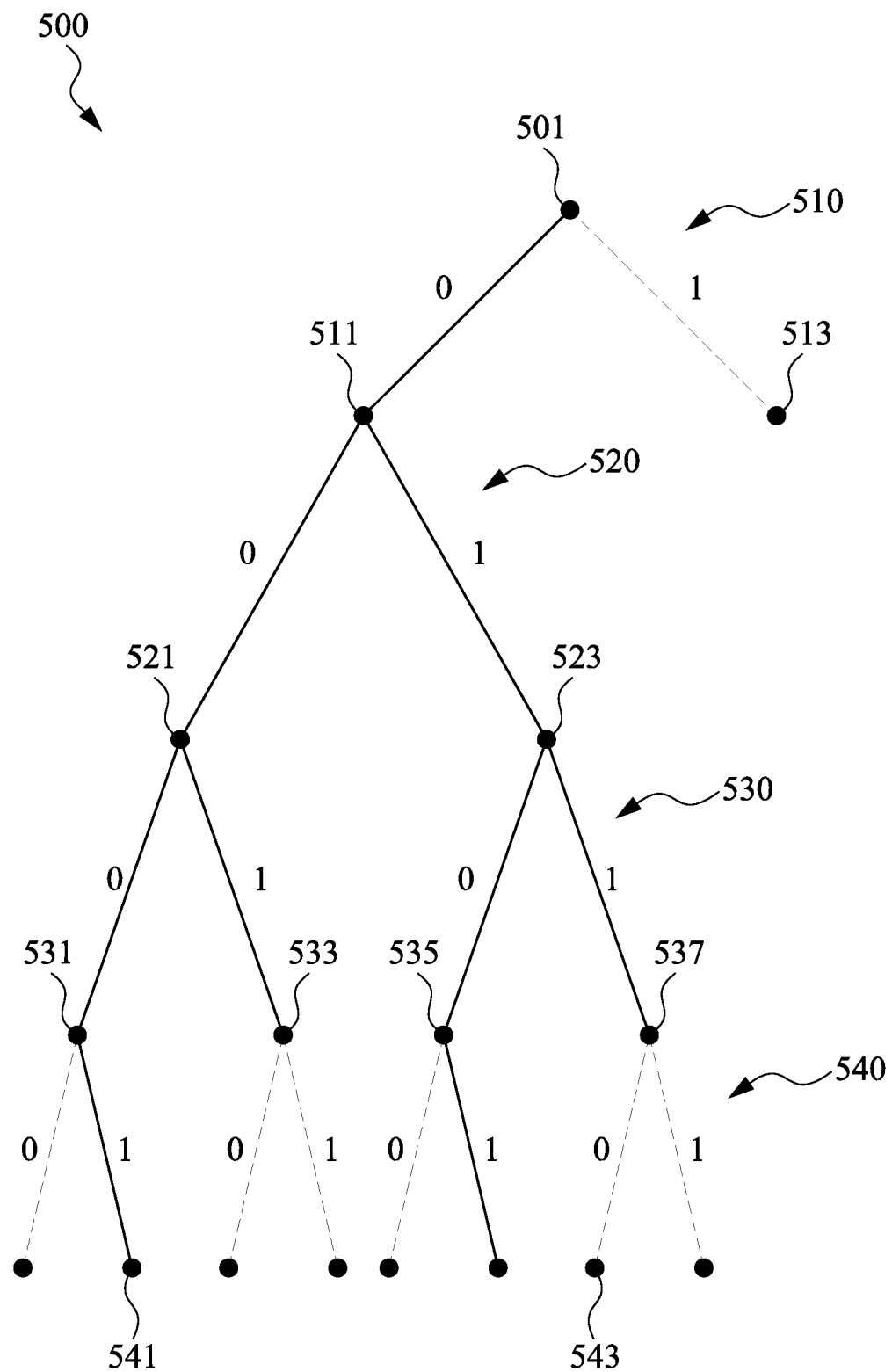
FIG. 5 is a decoding tree illustrating a successive cancellation list decoding procedure of a polar code according to some embodiments of the present disclosure.

Reference is made to FIG. 5. FIG. 5 is a decoding tree 500 illustrating the successive cancellation list decoding procedure of the polar code according to some embodiments of the present disclosure. When the first decoder 310 executes the polar decoding procedure, the decoding tree 500 will be generated. In some embodiment, the decoding tree 500 includes a plurality of levels. As shown in FIG. 5, the decoding tree 500 includes a root 501 and four levels 510~540 under the root 501. It should be understood that the number of levels of the decoding tree 500 associates with the number of bits of the code data. At the decoding tree 500, each level corresponds to an error rate. The error rate represents, for example, the channel condition while the code data is decoded. In the polar decoding procedure, the first decoder 310 decides one or more possible or correct path(s) at each level from top to bottom according to the list having the variable list size, which the number of selected paths corresponds to the variable list size.

In some embodiment, at the level 510 shown in FIG. 5, there are two paths, 0 and 1, at the left and right branches at the root 501. As shown in Table 1, the list is illustrated for the level 510. In some embodiment, the variable list size is set a default value, such as 4, for the first level of the decoding tree 500. It should be noted that the document is not limited thereto. Since the variable list size is 4 which is more than the number of the paths, the two paths of the decoding tree 500 (or called node 511 and 513) will be reserved. In another embodiment, at the level 510 again, the error rate of the level 510 is 0.5, and a frozen bit is set as the decoded bit, such as the bit '0'. Accordingly, a node 511 of the left branch of the decoding tree 500 is reserved in the decoding procedure, and the right branch of the decoding tree 500 is pruned from the decoding procedure. The pruned subtree will be not considered in the following decoding steps.

TABLE 1 the list for the level 510

| List | Path |
|---|---|
| 1 | 0 |

At the level 520, there are two possible paths by extending from the two former paths. Before pruning the path(s) from two possible paths, the first decoder 310 determines whether to change the variable list size for the level 520. In some embodiment, the first decoder 310 will compare the error rate of the level 520 with an error threshold. If the error rate of the level 520 is less than the error threshold, the variable list size will be reduced. On the other hand, of the error rate of the level 520 is larger than the error threshold, the variable list size will be increased. For example, the error rate of the level 520 is 0.000001 and the error threshold is 0.00001. The error rate of the level 520 which is less than the error threshold. Accordingly, the variable list size is reduced by half, such as 2. The variable list size is 2 in the level 520.

As shown in Table 2, illustrating the list for the level 520. Since the list size is 2 which is equal to the number of the paths, the two paths will be reserved. That is, the node 521 and 523 are reserved. In some embodiments, the paths "00" and "01" are reserved.

TABLE 2 the list for the level 520

| List | Path |
|---|---|
| 1 | 00 |
| 2 | 01 |

At the level 530, there are four possible paths by extending from the two former paths (for example, two paths will be extended respectively at the node 521 and 523). Before pruning the path(s) from four possible paths, the first decoder 310 determines whether to change the variable list size for the level 530. In some embodiment, the first decoder 310 will compare the error rate of the level 530 with the error threshold. If the error rate of the level 530 is larger than the error threshold, the variable list size will be increased. For example, the error rate of the level 530 is 0.0002. The error rate of the level 530 is larger than the error threshold 0.0001. Accordingly, the variable list size is increased by half, such as 4. The variable list size is 4 in the level 530.

As shown in Table 3, illustrating the list for the level 530. Since the list size is 4 which is equal to the number of the paths, the four paths will be reserved. That is, the node 531, 533, 535 and 537 are reserved. In some embodiments, the paths "000", "001", "010", and "011" are reserved.

TABLE 3 the list for the level 530

| List | Path |
|---|---|
| 1 | 000 |
| 2 | 001 |
| 3 | 010 |
| 4 | 011 |

Similarly, at the level 540, there are eight possible paths by extending from the four former paths (for example, four paths will be extended respectively at the node 531, 533, 535, and 537). Before pruning the path(s) from the eight possible paths, the first decoder 310 determines whether to change the variable list size for the level 540. In some embodiment, the first decoder 310 will compare the error rate of the level 540 with an error threshold. If the error rate of the level 530 is less than the error threshold, such as 0.0001, the variable list size will be reduced. For example, the error rate of the level 540 is 0.000003. The error rate of the level 540 is less than the error threshold 0.0001. Accordingly, the variable list size is decreased by half, such as 2. The variable list size is 2 in the level 540.

As shown in Table 4, illustrating the list for the level 540. Since the list size is 2 which is less than the number of the possible paths, only 2 paths will be reserved and other 6 paths should be discarded from the 8 possible paths. In some embodiments, it is supposed that the paths (shown as the dash line) "0000", "0010", "0011", "0100", "0110", and "0111" contain the lower reliability information (or higher frame error rate). Hence, the paths "0000", "0010", "0011", "0100", "0110", and "0111" are discarded and the paths "0001" (node 541), and "0101" (node 543) are reserved.

TABLE 4 the list for the level 540

| List | Path |
|---|---|
| 1 | 0001 |
| 2 | 0101 |

As illustrated above, each of the paths has corresponding correct probability. The higher the reliability is, the higher the correct probability is. As shown in Table 5, in traditional polar decoding procedure, the path having the highest correct probability, such as the path "0001", will be chosen as the output data, that is, the polar decoded data. However, the probabilities are estimated values and there may be some errors in the estimations. That is, the path with the highest correct probability can be the wrong data.

TABLE 5 the correct probability of each path

| List | Path | Correct probability |
|---|---|---|
| 1 | 0001 | 0.99 |
| 2 | 0101 | 0.9 |

Therefore, referring to FIG. 4 again. In the operation S430, the intermediate decoding data is decoded by the second decoder 320, to generate the plain data.

As shown in Table 5, there are two paths, that is, two candidate data of the intermediate decoding data. In some embodiments, the intermediate decoding data contains the redundancy data. Subsequently, the second decoder 320 filters the candidate data by using the redundancy data of each candidate data. For example, the second decoder 320 computes the redundancy data to examine whether there is error occurred at the candidate data or not. Therefore, the second decoder 320 chooses the candidate data which matches the requirements of the redundancy data or other CRC code.

Reference is made to Table 6, illustrating the result of the examination by the second decoder 320. As shown in Table 6, the path "0001" which has the highest correct probability does not pass the error detection check by the CRC code. On the other hand, the path "0101" is the only one path passing the error detection check by the CRC code. Hence, the path "0101" will be chosen as the outputted data. The second decoder 320 decodes the outputted data, for example, the redundancy data of the outputted data is removed. Therefore, the plain data is generated.

TABLE 6 the result of the error detecting examination

| List | Path | Correct probability | PASS examination? |
|---|---|---|---|
| 1 | 0001 | 0.99 | NO |
| 2 | 0101 | 0.9 | YES |

In another embodiment, reference is made to Table 7, another result of the examination by the second decoder 320 (not shown in FIG. 5) is illustrated. As shown in Table 7, the path "1001" and the path "1111" both pass the error detection check by the CRC code. In this example, the path with the highest probability, which path also passes the examination, will be chosen as the outputted data. Hence, the path "1001" will be chosen as the outputted data. The second decoder 320 decodes the outputted data, for example, removes the redundancy data of the outputted data. Therefore, the plain data is generated.

TABLE 7 the result of the error detecting examination

| List | Path | Correct probability | PASS examination? |
|------|------|---------------------|-------------------|
| 1 | 0001 | 0.99 | NO |
| 2 | 1001 | 0.9 | YES |
| 3 | 1011 | 0.88 | NO |
| 4 | 1111 | 0.8 | YES |

In some embodiments, the coding system 100 and the decoding system 300 are disposed on a storage system. For example, the storage system may execute the method for encoding data to generate the code data. Hence, it is the code data stored. On the other hand, while the code data is retrieved, the storage system may execute the method for decoding data to generate the plain data.

As illustrated above, the present disclosure provides the coding system 100 and method thereof and the decoding system 300 and method thereof, which apply the polar codes and the error detection/correction codes on data. In the polar decoding procedure, the size of the successive cancellation list is changed according to the error rate of each level in the decoding tree. The size of the successive cancellation list affects the decoding complexity, for example, the larger the list is, the larger the decoding complexity costs. The traditional polar decoding procedure applies the fixed size successive cancellation list, and hence the decoding complexity will be fixed at the larger value. Taking one level of the decoding tree as an example, such as the level 540 in FIG. 5 of the disclosure. If the traditional polar decoding procedure applies the fixed list size, such as 4, at the level 540, there are 4 paths reserved, however, in the disclosure there are only 2 paths reserved that cost half of the complexity of the traditional decoding procedure. Furthermore, based on the advanced polar decoding procedure in the disclosure, the decoded polar code data concatenated with the error detection/correction codes, the code data which passes the error detection/correction procedure will be outputted as the correct decoding data instead of the code data with the highest correct probability. Therefore, the present disclosure ensures the decoding accuracy at the coding and the decoding procedure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A decoding system, comprising:
   a first decoder, configured to generate an intermediate decoding data by decoding a code data according to a list having a variable list size in a first decoding algorithm; and
   a second decoder, coupled to the first decoder, wherein the second decoder is configured to generate a plain data by decoding the intermediate decoding data in a second decoding algorithm;
   wherein the first decoder is further configured to:
   decode the code data by using a polar code and execute a decoding procedure of the polar code which generates a decoding tree comprising a plurality of levels;
   determine the variable list size according to an error rate of each of the plurality of levels; and
   obtain the intermediate decoding data according to the variable list size, wherein each of the intermediate decoding data comprises a plurality of candidate data and a number of the plurality of candidate data is equal to the variable list size.

2. The decoding system of claim 1, wherein the plurality of levels comprises a first level and a second level and the first level comprises a first number of nodes and the second level comprises a second number of nodes, wherein the first decoder is further configured to:
   reduce the variable list size in response to the error rate of the first level being less than an error threshold; and
   keep the candidate data, which number is equal to the variable list size which is reduced, from the nodes of the first level.

3. The decoding system of claim 2, wherein the first decoder is further configured to:
   increase the variable list size in response to the error rate of the first level being larger than the error threshold; and
   keep the candidate data, which number is equal to the variable list size which is increased, from the nodes of the second level.

4. The decoding system of claim 1, wherein each of the candidate data comprises a redundancy data corresponding to a cyclic redundancy check (CRC) code, and the second decoder is further configured to filter the candidate data by using the redundancy data of each of the candidate data, and to choose the candidate data which passes an error detection check of the CRC code.

5. The decoding system of claim 4, wherein the second decoder is further configured to remove the redundancy data of the candidate data which is chosen in order to generate the plain data.

6. The decoding system of claim 4, wherein the decoding procedure comprises a successive cancellation list decoding procedure, wherein the first decoder is further configured to execute the successive cancellation list decoding procedure to generate a plurality of decoding paths where each of the plurality of decoding path comprises the candidate data in a first level and the candidate data in a second level, wherein each of the decoding paths comprises a correct probability.

7. The decoding system of claim 6, wherein the first decoder is configured to select a decode path which comprises a highest correct probability from the decoding paths.

8. The decoding system of claim 1, further comprising:
   an applied device, coupled to the first decoder, wherein the applied device is configured to output the code data to the first decoder.

9. A decoding method, suitable for a decoding system comprising a first decoder and a second decoder coupled to the first decoder, wherein the decoding method comprises:
   generating, by the first decoder, an intermediate decoding data by decoding a code data according to a list having a variable list size in a first decoding algorithm;

generating, by the second decoder, a plain data by decoding the intermediate decoding data in a second decoding algorithm;

decoding, by the first decoder, the code data by using a polar code and executing a decoding procedure of the polar code which generates a decoding tree comprising a plurality of levels;

determining, by the first decoder, the variable list size according to an error rate of each of the plurality of levels; and obtaining the intermediate decoding data according to the variable list size, wherein each of the intermediate decoding data comprises a plurality of candidate data and a number of the plurality of candidate data is equal to the variable list size.

10. The decoding method of claim 9, wherein the plurality of levels comprises a first level and a second level and the first level comprises a first number of nodes and the second level comprises a second number of nodes, wherein the decoding method further comprises:

reducing the variable list size in response to the error rate of the first level being less than an error threshold; and keeping the candidate data, which number is equal to the variable list size which is reduced, from the nodes of the first level.

11. The decoding method of claim 10, further comprising:

increasing the variable list size in response to the error rate of the first level being more than the error threshold; and keeping the candidate data, which number is equal to the variable list size which is increased, from the nodes of the second level.

12. The decoding method of claim 9, wherein each of the candidate data comprises a redundancy data corresponding to a cyclic redundancy check (CRC) code, and the decoding method further comprises:

filtering, by the second decoder, the candidate data by using the redundancy data of each of the candidate data; and choosing, by the second decoder, the candidate data which passes an error detection check by the CRC code.

13. The decoding method of claim 12, further comprising:

removing, by the second decoder, the redundancy data of the candidate data which is chosen in order to generate the plain data.

14. The decoding method of claim 12, further comprising:

executing, by the first decoder, a successive cancellation list decoding procedure to generate a plurality of decoding paths where each of the plurality of decoding path comprises the candidate data in a first level and the candidate data in a second level, wherein each of the decoding paths comprises a correct probability.

15. The decoding method of claim 14, further comprising:

selecting a decode path which comprises a highest correct probability from the decoding paths.

* * * * *